(12) United States Patent
Kita et al.

(10) Patent No.: US 10,510,649 B1
(45) Date of Patent: Dec. 17, 2019

(54) INTERCONNECT SUBSTRATE

(71) Applicant: SHINKO ELECTRIC INDUSTRIES CO., LTD., Nagano (JP)

(72) Inventors: Yoshihiro Kita, Nagano (JP); Hitoshi Kondo, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/418,168

(22) Filed: May 21, 2019

(30) Foreign Application Priority Data

May 31, 2018 (JP) ................. 2018-105370

(51) Int. Cl.
*H01L 23/498* (2006.01)
*H01L 21/48* (2006.01)
*H05K 1/09* (2006.01)
*H05K 1/02* (2006.01)

(52) U.S. Cl.
CPC .... *H01L 23/49822* (2013.01); *H01L 21/4857* (2013.01); *H01L 23/49827* (2013.01); *H01L 23/49894* (2013.01); *H05K 1/0277* (2013.01); *H05K 1/09* (2013.01); *H05K 2201/09509* (2013.01)

(58) Field of Classification Search
CPC ...... H05K 1/0353; H05K 1/036; H05K 1/115; H01L 23/49822; H01L 23/49827; H01L 23/49894; H01L 21/4857
See application file for complete search history.

(56) References Cited

U.S. PATENT DOCUMENTS 10,009,992 B2 * 6/2018 Vrtis ................... H05K 1/0201
2012/0319254 A1 * 12/2012 Kikuchi .............. H01L 23/5389
257/659
2017/0106629 A1 * 4/2017 Hayashi ................. B32B 27/30

FOREIGN PATENT DOCUMENTS

JP 2003-204169 7/2003

* cited by examiner

*Primary Examiner* — Timothy J Thompson
*Assistant Examiner* — Amol H Patel
(74) *Attorney, Agent, or Firm* — IPUSA, PLLC

(57) ABSTRACT

An interconnect substrate includes an insulating layer having a first resin layer and a second resin layer covering an upper surface of the first resin layer, a first conductive layer having an upper surface and side surfaces covered with the first resin layer, a lower surface of the first conductive layer being exposed from a lower surface of the first resin layer, and a second conductive layer including an interconnect pattern and a via interconnect, the interconnect pattern being disposed on an upper surface of the second resin layer, the via interconnect penetrating through both the second resin layer and the first resin layer to connect the interconnect pattern to the upper surface of the first conductive layer, wherein the first resin layer is made of a resin having a higher modulus of elasticity and a lower coefficient of elongation than the second resin layer.

6 Claims, 11 Drawing Sheets

INTERCONNECT SUBSTRATE

CROSS-REFERENCE TO RELATED APPLICATIONS

The present application is based upon and claims priority to Japanese Patent Application No. 2018-105370 filed on May 31, 2018, with the Japanese Patent Office, the entire contents of which are incorporated herein by reference.

FIELD

The present disclosures herein relate to an interconnect substrate and a method of making the interconnect substrate.

BACKGROUND

In a flexible interconnect substrate usable for a wearable terminal or the like, a resin material having a low modulus of elasticity and a high coefficient of elongation may be used as a material for an insulating layer that covers a conductive layer. In such an interconnect substrate, interconnect patterns are formed on the insulating layer, and are electrically coupled to the conductive layer through via interconnects disposed inside via holes that are formed through the insulating layer. The via holes may be made by a laser, for example.

A laser generates a large amount of thermal energy when forming the via holes through the insulating layer. When a resin material having a low modulus of elasticity and a high coefficient of elongation is used as the material of the insulating layer covering joint points between the via interconnects and the conductive layer, the stress caused by a difference in thermal expansion coefficients between the conductive layer and the insulating layer is not sufficiently mitigated, resulting in the reduction of adhesion between the conductive layer and the insulating layer. Further, the resin having a low modulus of elasticity and a high coefficient of elongation may be damaged by the thermal energy of laser, resulting in the reduction of adhesion between the conductive layer and the insulating layer.

The reduction of adhesion between the conductive layer and the insulating layer may increase a risk of haloing (i.e., fracture or delaminating resulting from mechanical causes) at the desmear process performed after the forming of via holes with a laser. Haloing causes a short fault between adjacent via interconnects, which reduces the reliability of connections between the interconnect patterns of an interconnect substrate.

Accordingly, there may be a need to provide an interconnect substrate for which haloing is less likely to occur.

RELATED-ART DOCUMENTS

Patent Document

[Patent Document 1] Japanese Patent Application Publication No. 2003-204169

SUMMARY

According to an aspect of the embodiment, an interconnect substrate includes an insulating layer having a first resin layer and a second resin layer covering an upper surface of the first resin layer, a first conductive layer having an upper surface, a lower surface, and side surfaces, the upper surface and the side surfaces of the first conductive layer being covered with the first resin layer, the lower surface of the first conductive layer being exposed from a lower surface of the first resin layer, and a second conductive layer including an interconnect pattern and a via interconnect, the interconnect pattern being disposed on an upper surface of the second resin layer opposite from a lower surface thereof that is in contact with the upper surface of the first resin layer, the via interconnect penetrating through both the second resin layer and the first resin layer to connect the interconnect pattern to the upper surface of the first conductive layer, wherein the first resin layer is made of a resin having a higher modulus of elasticity and a lower coefficient of elongation than the second resin layer.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

[Structure of Interconnect Substrate of First Embodiment]

Figure 1:
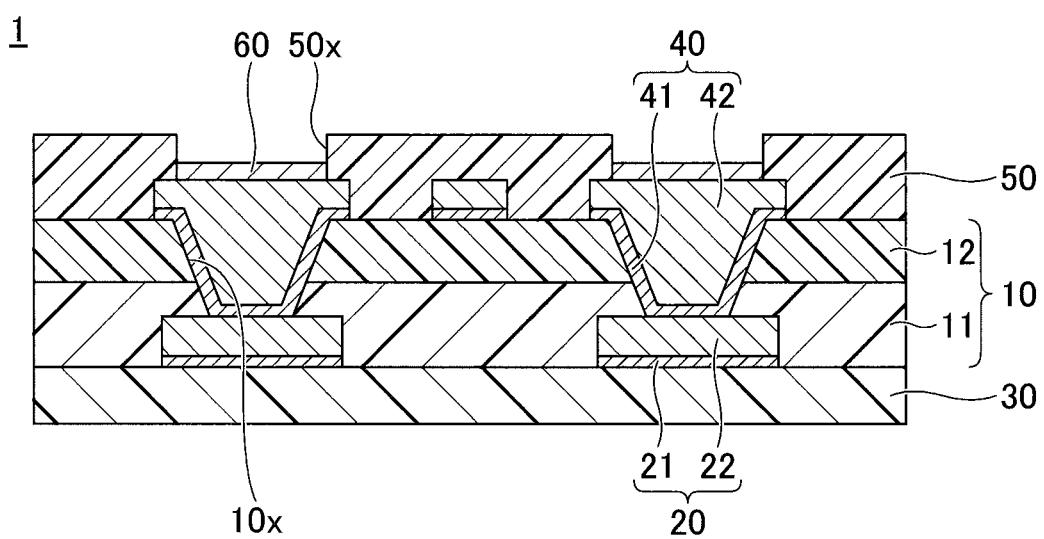
FIG. 1 is a cross-sectional view illustrating an example of an interconnect substrate according to the first embodiment.

In the following, the structure of an interconnect substrate of a first embodiment will be described. FIG. 1 is a cross-sectional view illustrating an example of an interconnect substrate according to the first embodiment.

Referring to FIG. 1, the interconnect substrate 1 according to the first embodiment is a coreless buildup interconnect substrate which includes an insulating layer 10, a conductive layer 20, an insulating layer 30, a conductive layer 40, and a solder resist layer 50.

In the present embodiment, for the sake of convenience, the side of the interconnect substrate 1 on which the solder resist layer 50 is situated is referred to as an upper side or a first side, and the side on which the insulating layer 30 is situated is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the interconnect substrate 1 may be used in an upside-down position, or may be placed at any angle. Further, a plan view refers to a view taken in the direction perpendicular to the first surface of the solder resist layer 50, and a planar shape refers to the shape of an object as viewed in the direction perpendicular to the first surface of the solder resist layer 50.

The insulating layer 10 is an inter-layer insulating layer having a two-layer structure, which includes a first resin layer 11 and a second resin layer 12 covering the upper surface of the first resin layer 11.

The first resin layer 11 is made of a resin having a higher modulus of elasticity and a lower coefficient of elongation than the second resin layer 12. Materials for the first resin layer 11 include, for example, thermosetting resin compositions including a biphenyl structure, a bixylenol structure, a bisphenol acetophenone structure, and a bisphenol fluorene structure. The material of the first resin layer 11 resulting from thermal curing is similar to plastic. The first resin layer 11 may contain a filler such as silica ($SiO_2$).

The modulus of elasticity of the first resin layer 11 is greater than or equal to 3 GPa and less than or equal to 10 GPa, and is preferably about 5 GPa. The coefficient of elongation of the first resin layer 11 is greater than or equal to 2% and less than or equal to 10%, and is preferably about 6%. The heat resistance temperature of the first resin layer 11 is preferably greater than or equal to 260 degrees of Celsius.

The thickness of the first resin layer 11 may be about 5 to 10 micrometers, for example. The thickness of the resin layer or the solder layer each covering a respective conductive layer is defined as the distance from the upper surface of the conductive layer to the upper surface of the resin layer or the solder resist layer covering the conductive layer.

The second resin layer 12 covers the entire upper surface of the first resin layer 11. The second resin layer 12 is made of a resin having a lower modulus of elasticity and a higher coefficient of elongation than the first resin layer 11. Materials for the second resin layer 12 include, for example, an epoxy resin, a compound having a butadiene structure and a phenolic hydroxyl group, and a thermosetting resin composition including a phenoxy resin. The material of the second resin layer 12 resulting from thermal curing is similar to rubber. The second resin layer 12 may contain a filler such as silica ($SiO_2$).

The modulus of elasticity of the second resin layer 12 is greater than or equal to 0.01 GPa and less than or equal to 0.1 GPa, and is preferably about 0.04 GPa. The coefficient of elongation of the second resin layer 12 is greater than or equal to 50% and less than or equal to 200%, and is preferably about 100%. The heat resistance temperature of the second resin layer 12 is preferably greater than or equal to 260 degrees of Celsius.

The thickness of the second resin layer 12, which may be thicker than the first resin layer 11, may be in the range of approximately 50 to 150 micrometers, for example.

The conductive layer 20 includes an adhesion layer 21 and an interconnect layer 22 formed on the upper surface of the adhesion layer 21, and is embedded in the first resin layer 11. More specifically, the conductive layer 20 is covered with the first resin layer 11 such that the upper surface and side surface thereof (i.e., the upper surface of the interconnect layer 22, the side surface of the interconnect layer 22, and the side surface of the adhesion layer 21) are covered, while the lower surface thereof (i.e., the lower surface of the adhesion layer 21) is exposed from the lower surface of the first resin layer 11. The lower surface of the first resin layer 11 and the lower surface of the conductive layer 20 (i.e., the lower surface of the adhesion layer 21) may be flush with each other, for example.

Copper (Cu) or nickel (Ni), for example, may be used as the material of the adhesion layer 21. The thickness of the adhesion layer 21 may approximately be 0.01 to 1 micrometer, for example. Copper (Cu) may be used as the material of the interconnect layer 22. The thickness of the interconnect layer 22 may be about 10 to 20 micrometers, for example.

The conductive layer 20 may be routed over other areas of the insulating layer 30 in addition to the connection points with the via interconnects of the conductive layer 40.

The insulating layer 30 is the lowermost insulating layer that covers the lower surface of the first resin layer 11 and the lower surface of the conductive layer 20 (i.e., the lower surface of the adhesion layer 21). In other words, the adhesion layer 21 is formed on the upper surface of the insulating layer 30, and the interconnect layer 22 is formed on the adhesion layer 21. The first resin layer 11 is then formed on the upper surface of the insulating layer 30 to cover the conductive layer 20 (i.e., the upper surface of the interconnect layer 22, the side surface of the interconnect layer 22, and the side surface of the adhesion layer 21). The insulating layer 30 is made of the same resin as the second resin layer 12, i.e., a resin having a lower modulus of elasticity and a higher coefficient of elongation than the first resin layer 11. The thickness of the insulating layer 30 may be about 50 to 150 micrometers, for example.

The conductive layer 40 is formed on the upper surface of the insulating layer 10. The conductive layer 40 includes via interconnects disposed in via holes 10x that pass through the insulating layer 10 (i.e., the second resin layer 12 and the first resin layer 11) to expose the upper surface of the conductive layer 20 (i.e., the upper surface of the interconnect layer 22), and also includes interconnect patterns formed on the upper surface of the second resin layer 12. The via interconnects constituting the conductive layer 40 connects the interconnect patterns constituting the conductive layer 40 to the upper surface of the conductive layer 20. Namely, the conductive layer 40 is electrically coupled to the conductive layer 20 exposed in the via holes 10x.

The shape of the via holes 10x is a frustum of a right circular cone having an upper end toward the solder resist layer 50 and a bottom end at the upper surface of the conductive layer 20, with the diameter of the upper end being larger than the diameter of the bottom end.

Each of the via interconnects and interconnect patterns that constitute the conductive layer 40 includes an adhesion layer 41 and an interconnect layer 42 laminated on the upper surface of the adhesion layer 41. The material and thickness of the adhesion layer 41 may be similar to the material and thickness of the adhesion layer 21, for example. The material of the interconnect layer 42 and the thickness of the interconnect patterns of the interconnect layer 42 may be similar to the material and thickness of the interconnect layer 22, for example.

The solder resist layer 50 is formed to coat the conductive layer 40 on the upper surface of the second resin layer 12. The solder resist layer 50 has openings 50x. The conductive layer 40 is partially exposed at the deepest end of the openings 50x. The conductive layer 40 exposed at the deepest end of the openings 50x serve as pads for electrical connection with another interconnect substrate, a semiconductor package, a semiconductor chip, or the like. The material of the solder resist layer 50 may be a photosensitive insulating epoxy-based resin, a photosensitive insulating acrylic resin, or the like. The thickness of the solder resist layer 50 may be about 5 to 10 micrometers, for example.

A metal layer 60 is formed on the upper surface of the conductive layer 40 exposed from the opening 50x. The metal layer 60 may be provided according to need, and is not an essential element of the interconnect substrate 1. Examples of the metal layer 60 include an Au layer, an Ni/Au layer (i.e., a metal layer in which the Ni layer and the Au layer are laminated in this order), an Ni/Pd/Au layer (i.e., a metal layer in which the Ni layer, the Pd layer, and the Au layer are laminated in this order), and the like. In place of forming of the metal layer 60, anti-oxidizing treatment such as OSP (i.e., organic solderability preservative) treatment or the like may be applied. A surface-treatment film formed by the OSP process is an organic coating film made of azole compound, imidazole compound, or the like.

[Method of Making Interconnect Substrate of First Embodiment]

In the following, a method of making the interconnect substrate of the first embodiment will be described. FIGS. 2A through 5C are drawings illustrating examples of process steps for making the interconnect substrate according to the first embodiment. For the sake of convenience of explanation, the present embodiment is directed to an example of process steps that fabricate one interconnect substrate on a support member and then remove the support member. Alternatively, the process steps may be such that a portion to become a plurality of interconnect substrates may be fabricated on a support member, and is then divided into individual pieces after the support member is removed, thereby forming each interconnect substrate.

Figure 2A:
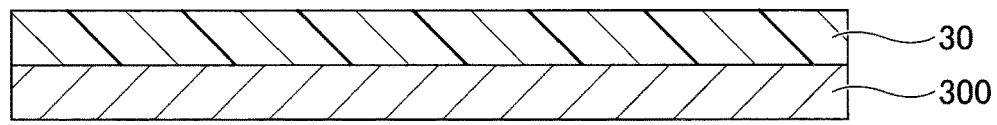
FIGS. 2A through 2D are drawings illustrating an example of process steps of making the interconnect substrate according to the first embodiment.

In the process step illustrated in FIG. 2A, a support body 300 having a flat upper surface is put in place, and, then, the insulating layer 30 is formed on the upper surface of the support body 300. A metal plate, a metal foil, or the like may be used as the support body 300. In the present embodiment, a copper foil is used as the support body 300. The thickness of the support body 300 may be about 18 to 100 micrometers, for example. The insulating layer 30 may be formed, for example, by laminating, and then curing, a resin film in a B-stage state (semi-cured state) on the upper surface of the support body 300. Alternatively, a liquid or paste resin may be applied to the upper surface of the support body 300 by screen printing, roll coating, spin coating, or the like, followed by curing. The material and thickness of the insulating layer 30 are the same as those previously described.

Figure 2B:
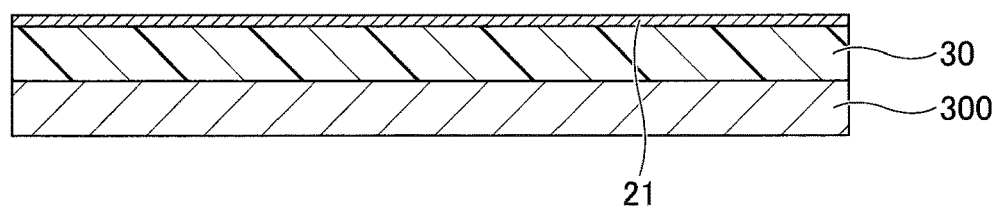

In the process step illustrated in FIG. 2B, the adhesion layer 21 is formed on the entire upper surface of the insulating layer 30. The adhesion layer 21 serves as a seed layer for forming the interconnect layer 22. The adhesion layer 21 may be formed by electroless plating or sputtering, for example. The material and thickness of the adhesion layer 21 are the same as those previously described.

Figure 2C:
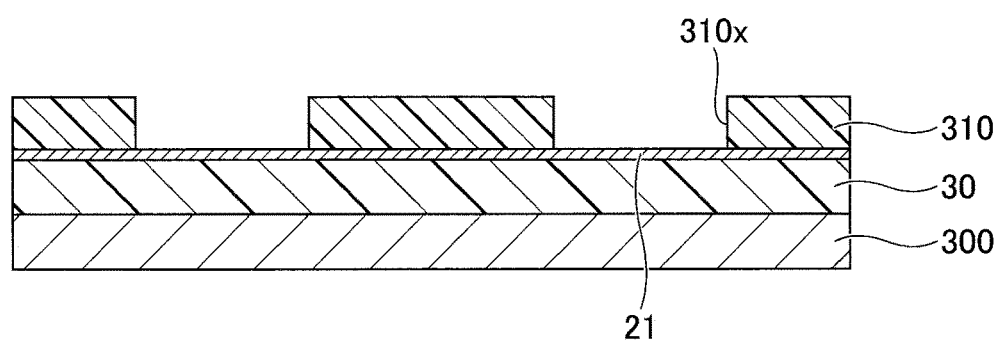

In the process step shown in FIG. 2C, a resist layer 310 with openings 310x situated at the positions corresponding to the prospective positions of the interconnect layer 22 is formed on the upper surface of the adhesion layer 21. Specifically, a photosensitive dry film resist is laminated to the upper surface of the adhesion layer 21 as the resist layer 310, and, then, the openings 310x are formed by exposure and development.

Figure 2D:
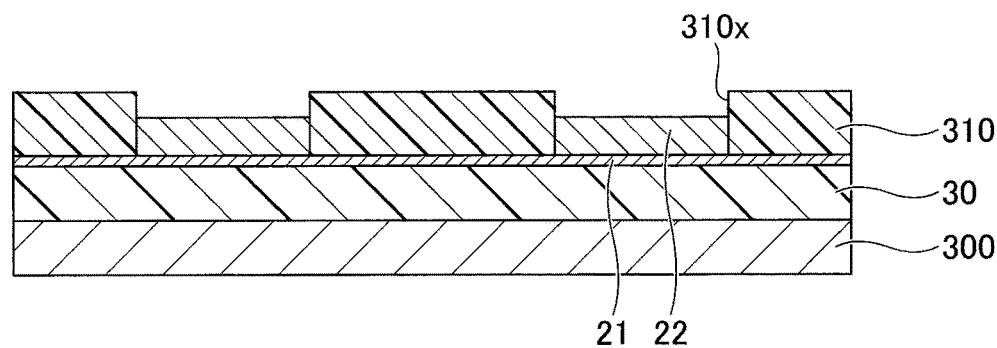

In the process step illustrated in FIG. 2D, the interconnect layer 22 is formed on the upper surface of the adhesion layer 21 that is exposed in the openings 310x of the resist layer 310. The interconnect layer 22 may be formed by use of electrolytic plating that utilizes the adhesion layer 21 as a power feed layer, for example. The material and thickness of the interconnect layer 22 are the same as those previously described.

Figure 3A:
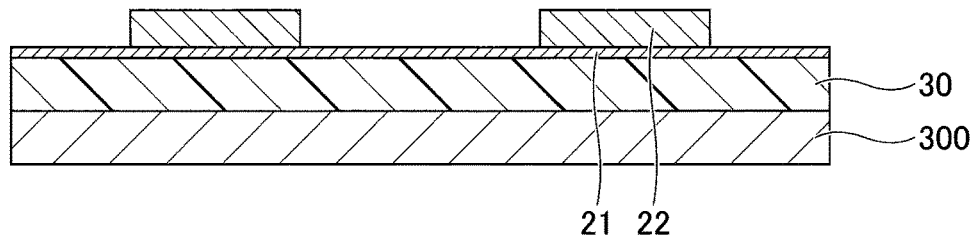
FIGS. 3A through 3D are drawings illustrating an example of process steps of making the interconnect substrate according to the first embodiment.
Figure 3B:
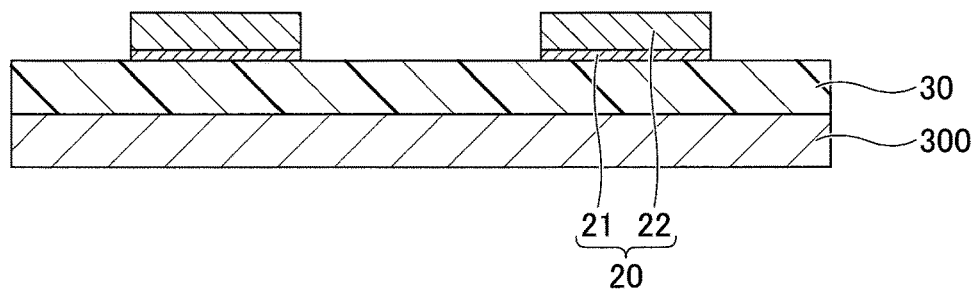

In the process step illustrated in FIG. 3A, the resist layer 310 is removed. In the process step illustrated in FIG. 3B, with the interconnect layer 22 being used as a mask, the portions of the adhesion layer 21 which are not covered by the interconnect layer 22 are removed by etching. With this arrangement, the conductive layer 20 in which the interconnect layer 22 is laminated on the upper surface of the adhesion layer 21 is formed on the insulating layer 30.

Figure 3C:
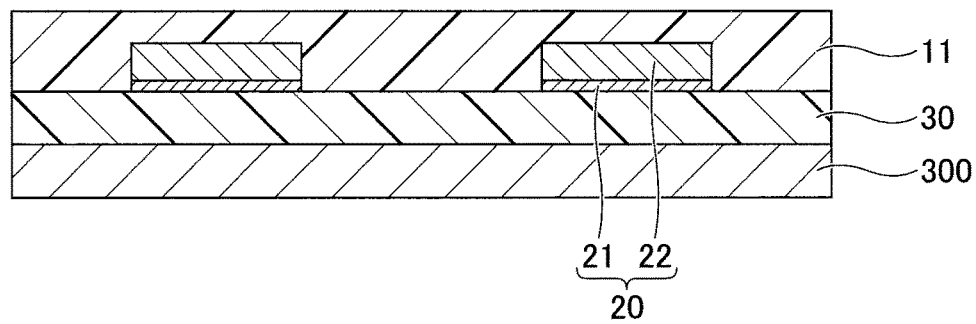

In the process step illustrated in FIG. 3C, the first resin layer 11 in a B-stage state (semi-cured state) is formed on the entire upper surface of the insulating layer 30 so as to cover the conductive layer 20. The first resin layer 11 may be formed, for example, by laminating a resin film in a B-stage state (semi-cured state) onto the entire upper surface of the insulating layer 30. Alternatively, a liquid or paste resin may be applied to the entire upper surface of the insulating layer 30 by screen printing, roll coating, spin coating, or the like. The material and thickness of the first resin layer 11 are the same as those previously described. In this process step, the first resin layer 11 is not yet cured.

Figure 3D:
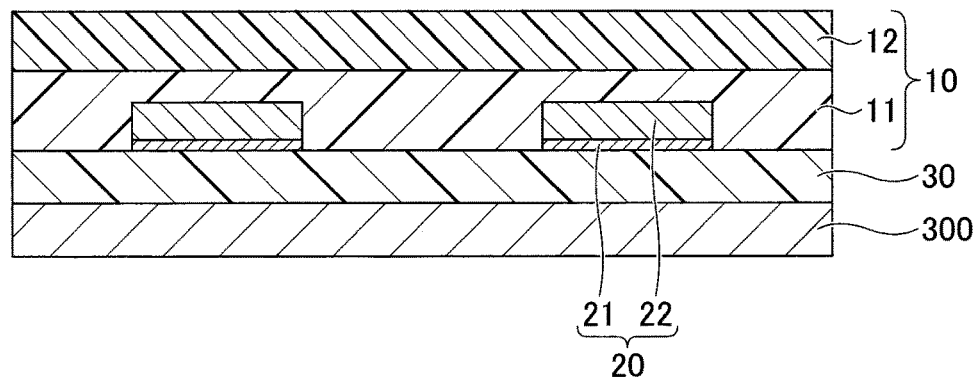

In the process step illustrated in FIG. 3D, the second resin layer 12 in a B-stage state (semi-cured state) is formed on the entire upper surface of the first resin layer 11. The second resin layer 12 may be formed, for example, by laminating a resin film in a B-stage state (semi-cured state) onto the entire upper surface of the first resin layer 11. Alternatively, a liquid or paste resin may be applied to the entire upper surface of the first resin layer 11 by screen printing, roll coating, spin coating, or the like. The material and thickness of the second resin layer 12 are the same as those previously described. After laminating the second resin layer 12 to the upper surface of the first resin layer 11, the first resin layer 11 and the second resin layer 12 are heated to a predetermined temperature to be cured, thereby forming the insulating layer 10. Pressure may also be applied while heating, if necessary.

Figure 4A:
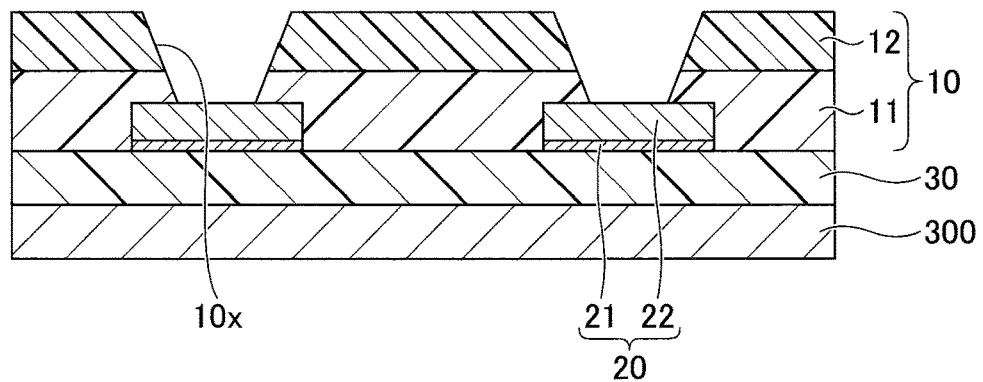
FIGS. 4A through 4C are drawings illustrating an example of process steps of making the interconnect substrate according to the first embodiment.

In the process step illustrated in FIG. 4A, the via holes 10x are formed through the insulating layer 10 (i.e., the second resin layer 12 and the first resin layer 11) such as to expose the upper surface of the conductive layer 20. The via holes 10x may be formed by a laser process utilizing $CO_2$ laser or the like, for example. The shape of the via holes 10x made by a laser process is a frustum of a right circular cone having an upper end toward the position of the solder resist layer 50 and a bottom end at the upper surface of the conductive layer 20, with the diameter of the upper end being larger than the diameter of the bottom end. When the via holes 10x are formed by a laser process, a desmear process is performed to remove resin residues, of the insulating layer 10, adhering to the upper surface of the conductive layer 20 exposed at the bottom of the via holes 10x.

Figure 4B:
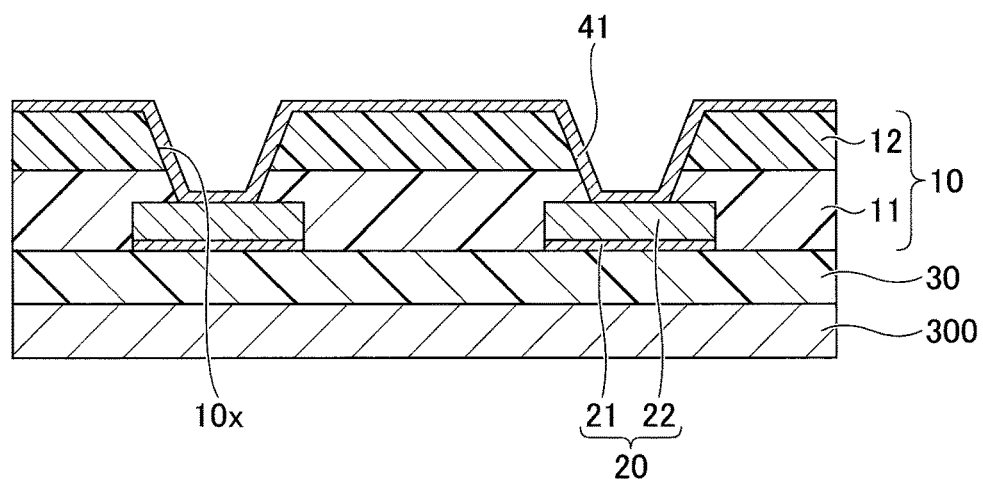

In the process step illustrated in FIG. 4B, the adhesion layer 41 is formed that continuously covers the entire upper surface of the insulating layer 10, the inner wall surfaces of the via holes 10x, and the upper surfaces of the conductive layer 20 exposed in the via holes 10x. The adhesion layer 41 serves as a seed layer for forming the interconnect layer 42. The adhesion layer 41 may be formed by electroless plating or sputtering, for example. The material and thickness of the adhesion layer 41 are the same as those previously described.

Figure 4C:
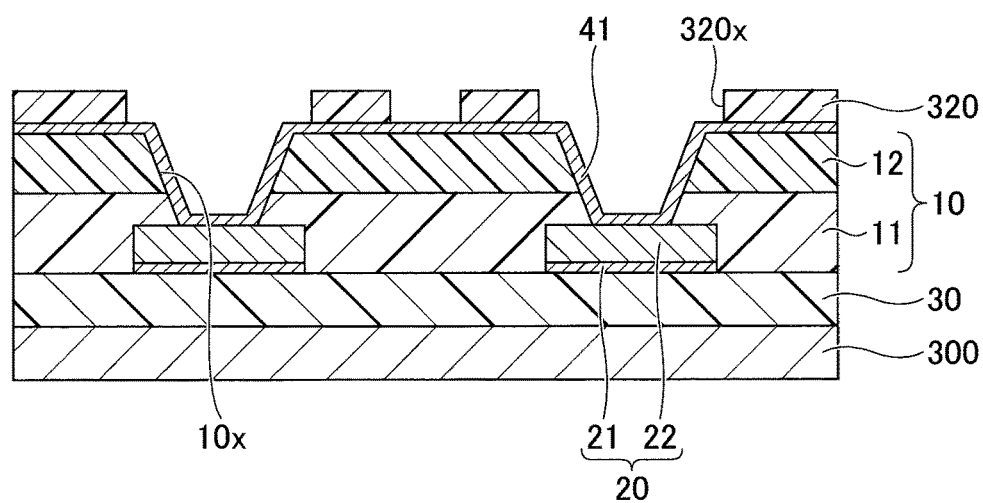

In the process step shown in FIG. 4C, a resist layer 320 with openings 320x situated at the positions corresponding to the prospective positions of the interconnect layer 42 is formed on the upper surface of the adhesion layer 41. Specifically, a photosensitive dry film resist is laminated to the upper surface of the adhesion layer 41 as the resist layer 320, and, then, the openings 320x are formed by exposure and development.

Figure 5A:
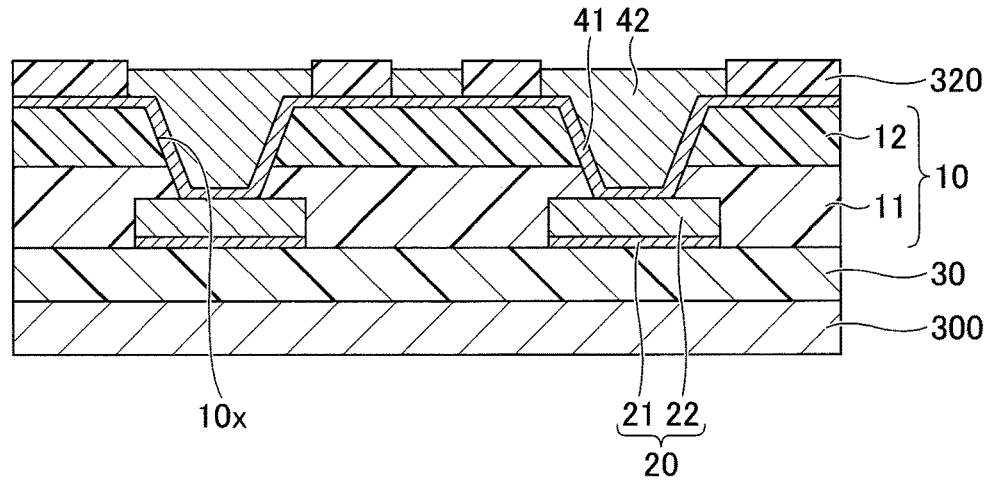
FIGS. 5A through 5C are drawings illustrating an example of process steps of making the interconnect substrate according to the first embodiment.

In the process step illustrated in FIG. 5A, the interconnect layer 42 is formed on the upper surface of the adhesion layer 41 that is exposed in the openings 320x of the resist layer 320. The interconnect layer 42 may be formed by use of electrolytic plating that utilizes the adhesion layer 41 as a power feed layer, for example. The material of the interconnect layer 42 and the thickness of interconnect patterns of the interconnect layer 42 are the same as those previously described.

Figure 5B:
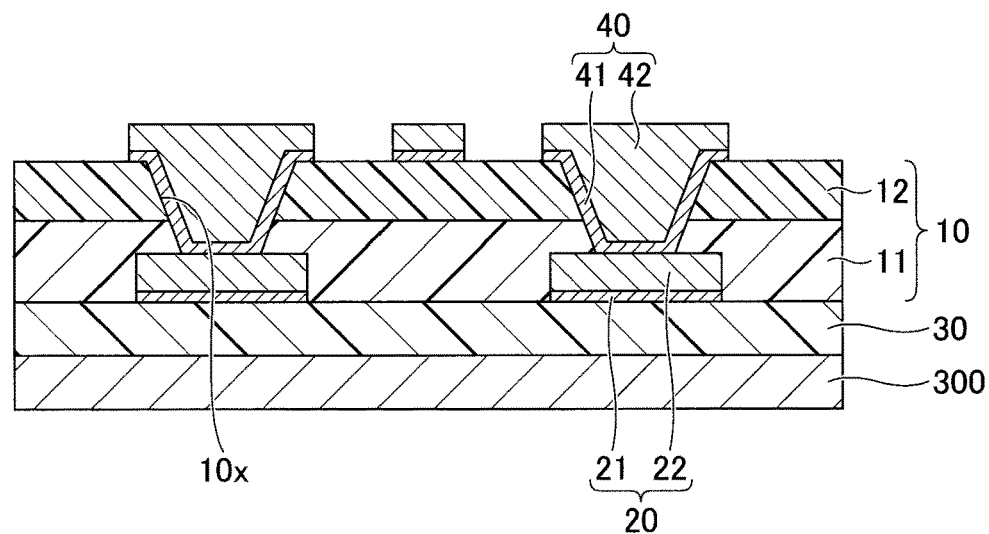

In the process step illustrated in FIG. 5B, with the interconnect layer 42 being used as a mask, the portions of the adhesion layer 41 which are not covered by the interconnect layer 42 are removed by etching after the resist layer 320 is removed. With this arrangement, the conductive layer 40 having the interconnect layer 42 laminated on the adhesion layer 41 is formed. The conductive layer 40 includes the via interconnects disposed in the via holes 10x and the interconnect patterns formed on the upper surface of the insulating layer 10. The conductive layer 40 is electrically connected to the conductive layer 20 that is exposed at the bottom of the via holes 10x.

Figure 5C:
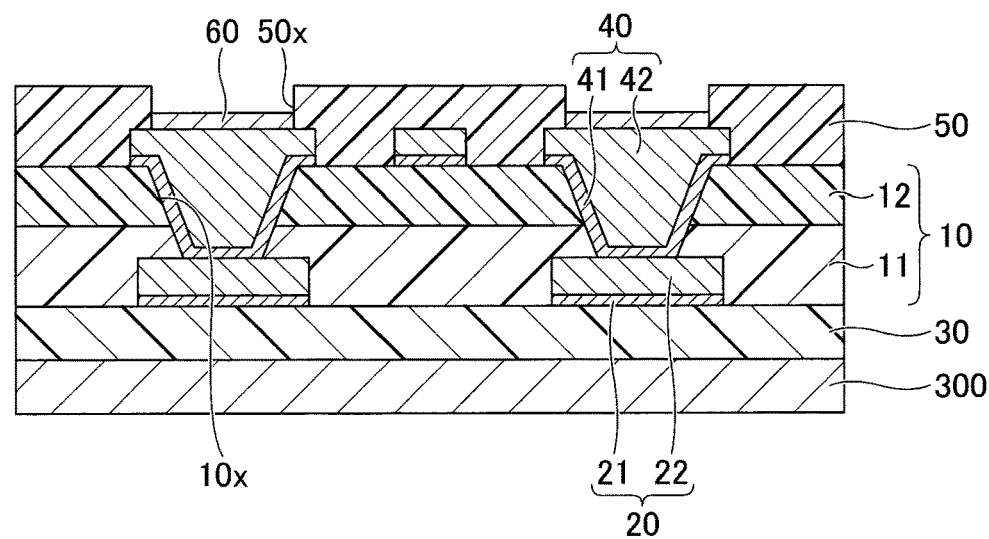

In the process step illustrated in FIG. 5C, the solder resist layer 50 having the openings 50x is formed on the insulating layer 10 to cover the conductive layer 40. The solder resist layer 50 may be formed by screen printing, roll coating, spin coating, or the like which applies a photosensitive insulating epoxy-based resin, a photosensitive insulating acrylic resin, or the like in liquid form or paste form, for example, onto the insulating layer 10 such as to cover the conductive layer 40. Alternatively, a film made of a photosensitive insulating epoxy-based resin, a photosensitive insulating acrylic resin, or the like may be laminated onto the insulating layer 10 such as to cover the conductive layer 40.

The applied or laminated insulating resin is then exposed to light and developed to form the openings 50x (i.e., by use of photolithography). With this arrangement, the solder resist layer 50 having the openings 50x is formed. Alternatively, a film made of an insulating resin having the openings 50x formed in advance may be laminated onto the insulating layer 10 such as to cover the conductive layer 40. A non-photosensitive insulating resin may be used as the material of the solder resist layer 50. In this case, after the solder resist layer 50 is formed and cured on the insulating layer 10, the openings 50x may be formed by blasting with an abrasive such as alumina abrasive grains, for example. Alternatively, screen printing may be used to form the solder resist layer 50 having the openings 50x.

With the arrangement described above, some portions of the conductive layer 40 are exposed in the openings 50x. The conductive layer 40 exposed in the openings 50x serve as pads for electrical connection with another interconnect substrate, a semiconductor package, a semiconductor chip, or the like. If desired, the metal layer 60 is formed on the upper surface of the conductive layer 40 exposed in the openings 50x by electroless plating or the like, for example. Examples of the metal layer 60 are the same as those previously described. Further, an anti-oxidizing treatment such as OSP treatment or the like may be applied to the upper surface of the conductive layer 40 exposed in the openings 50x.

After the process step illustrated in FIG. 5C, the support body 300 is removed to provide the interconnect substrate 1 (see FIG. 1) in final form. The support body 300 made of a copper foil may be removed by wet etching using a ferric chloride solution, a copper chloride solution, an ammonium persulfate solution, or the like, for example.

In the insulating layer 10 of the interconnect substrate 1 described above, the thickness (e.g., 5 to 10 micrometers) of the first resin layer 11 made of a resin having a high modulus of elasticity and a low coefficient of elongation is significantly less than the thickness (e.g., about 50 to 150 micrometers) of the second resin layer 12 made of a resin having a low modulus of elasticity and a high coefficient of elongation. This enables the realization of a flexible interconnect substrate 1 usable in a wearable terminal or the like.

In the interconnect substrate 1, the connection points between the via interconnects constituting the conductive layer 40 and the upper surface of the conductive layer 20 (i.e., the upper surface of the interconnect layer 22) are covered with the first resin layer 11, which is made of a resin having a high modulus of elasticity and a low coefficient of elongation. This arrangement relieves stress applied to the connection points, which results in a decrease in the deformation of connection points caused by mechanical stress, thereby improving the reliability of connection at the connection points. Specific examples of the improvement of connection reliability at the connection points will be described in the following.

A laser generates a large amount of thermal energy when forming the via holes 10x through the insulating layer 10. In such a case, if the connection points are covered with a layer (referred to as a resin layer X) made of a resin having a low modulus of elasticity and a high coefficient of elongation, the stress caused by the difference in thermal expansion coefficients between the conductive layer 20 and the resin layer X is not sufficiently relieved, which results in the reduction of adhesion between the conductive layer 20 and the resin layer X. The reduction of adhesion between the conductive layer 20 and the resin layer X may increase a risk of haloing (i.e., fracture or delaminating resulting from mechanical causes) between the conductive layer 20 and the resin layer X during the desmear process performed after the forming of the via holes 10x with a laser. Haloing causes a short fault between adjacent via interconnects, which reduces the reliability of connections between the interconnect patterns of the interconnect substrate 1.

In the interconnect substrate 1, on the other hand, the connection points are covered with the first resin layer 11 made of a resin having a high modulus of elasticity and a low coefficient of elongation. With this arrangement, the stress caused by a difference in thermal expansion coefficients between the conductive layer 20 and the first resin layer 11 when forming the via holes 10x through the insulating layer 10 with a laser is sufficiently relieved, which results in secure adhesion between the conductive layer 20 and the first resin layer 11. As a result, haloing is less likely to occur during the desmear process performed after the forming of the via holes 10x with a laser, which improves the reliability of connections between the interconnect patterns of the interconnect substrate 1.

<First Variation of First Embodiment>

A first variation of the first embodiment is directed to another example of the method of making the insulating layer 10. In connection with the first variation of the first embodiment, a description of the same or similar constituent elements as those of the previously provided descriptions may be omitted as appropriate.

Figure 6A:
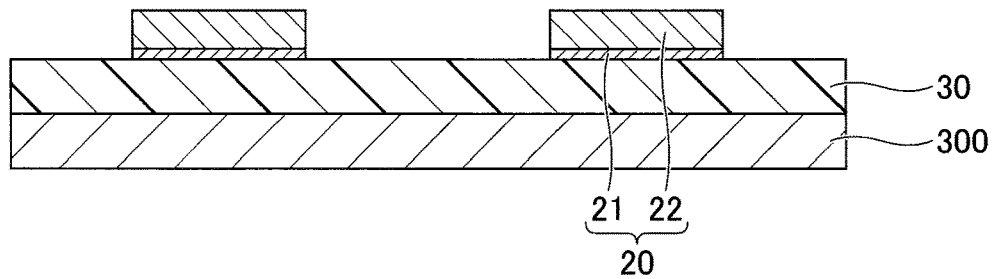
FIGS. 6A and 6B are drawings illustrating an example of the process steps of making an interconnect substrate according to a first variation of the first embodiment.
Figure 6B:
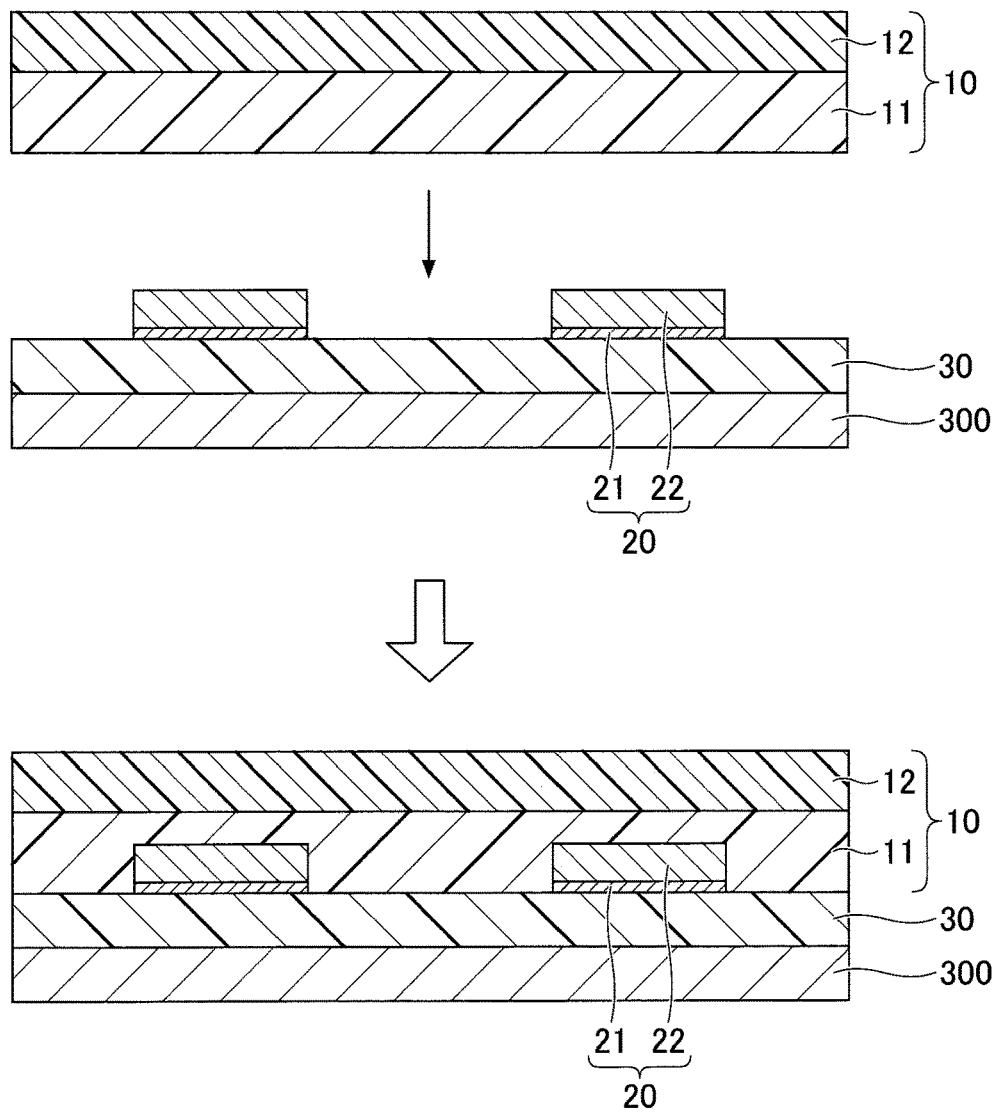

FIGS. 6A and 6B are drawings illustrating an example of the process steps of making an interconnect substrate according to the first variation of the first embodiment. The process steps similar to those illustrated in FIG. 2A through FIG. 3B for the first embodiment are performed to make the structure illustrated in FIG. 6A.

In the process step illustrated in FIG. 6B, the insulating layer 10 made of an insulating multilayer film in which the second resin layer 12 is laminated to the first resin layer 11 in advance is put in place. The insulating layer 10 is then laminated on the upper surface of the insulating layer 30 of the structure illustrated in FIG. 6A to cover the conductive layer 20. Subsequently, the insulating layer 10 is heated to a predetermined temperature for curing. Pressure may also be applied while heating, if necessary. Subsequent steps to be performed are the same as or similar to the steps starting at the step illustrated in FIG. 4A for the first embodiment.

In this manner, the first resin layer 11 and the second resin layer 12 may be sequentially laminated to the upper surface of the insulating layer 30 to form the insulating layer 10, or an insulating multilayer film having the second resin layer 12 laminated on the first resin layer 11 in advance may be laminated to the upper surface of the insulating layer 30 to form the insulating layer 10.

<Second Variation of First Embodiment>

A second variation of the first embodiment is directed to a configuration in which the first resin layer for covering the conductive layer has a modified shape. In connection with the second variation of the first embodiment, a description of the same or similar constituent elements as those of the previously provided descriptions may be omitted as appropriate.

Figure 7:
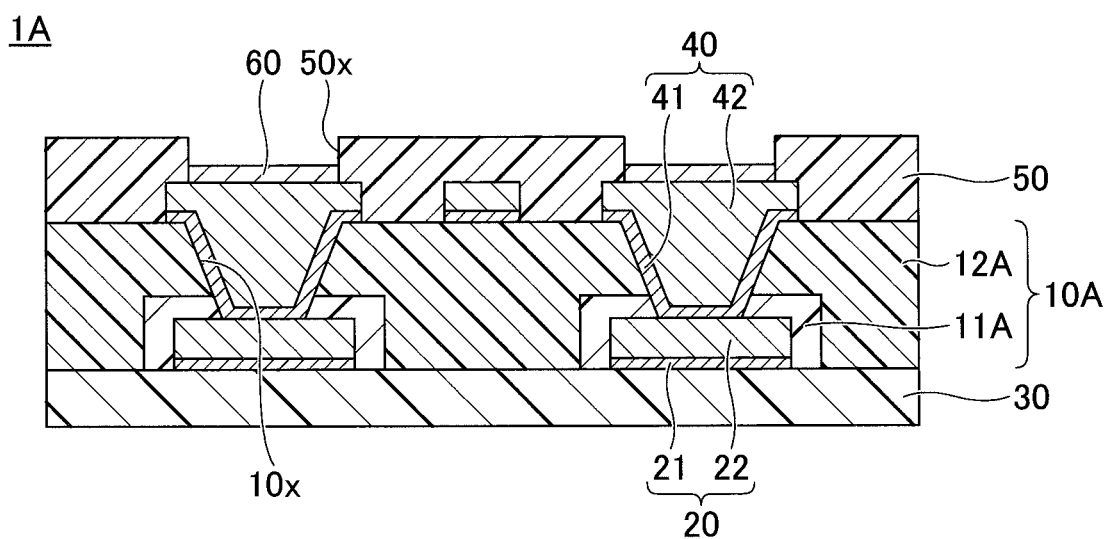
FIG. 7 is a cross-sectional view illustrating an example of an interconnect substrate according to a second variation of the first embodiment.

FIG. 7 is a cross-sectional view illustrating an example of an interconnect substrate according to the second variation of the first embodiment. In FIG. 7, an interconnect substrate 1A according to the second variation of the first embodiment differs from the interconnect substrate 1 (see FIG. 1) in that the insulating layer 10 is replaced with an insulating layer 10A.

The insulating layer 10A is an interlayer insulating layer having a two-layer structure in which a first resin layer 11A and a second resin layer 12A are provided.

The first resin layer 11A covers the upper surface and side surfaces of the conductive layer 20. Unlike the first resin layer 11 of the first embodiment, the first resin layer 11A is selectively formed along the upper surface and side surfaces of the conductive layer 20, and does not extend over the entire upper surface of the insulating layer 30. The first resin layer 11A may be made of a resin similar to that of the first resin layer 11.

The thickness of the first resin layer 11A formed on the upper surface of the conductive layer 20 and the thickness of the first resin layer 11A formed on each side surface of the conductive layer 20 may approximately be 5 to 10 micrometers, for example.

The second resin layer 12A is formed on the upper surface of the insulating layer 30 to cover the upper surface and side surfaces of the first resin layer 11A. The second resin layer 12A may be made of a resin similar to that of the second resin layer 12. The thickness of the second resin layer 12A (the thickness from the upper surface of the first resin layer 11A to the upper surface of the second resin layer 12A) may be greater than the thickness of the first resin layer 11A, and may approximately be 50 to 150 micrometers, for example.

FIGS. 8A through 8D are drawings illustrating an example of the process steps of making an interconnect substrate according to the second variation of the first embodiment. The process steps similar to those illustrated in FIG. 2A through FIG. 3B for the first embodiment are performed to make the structure illustrated in FIG. 8A.

Figure 8A:
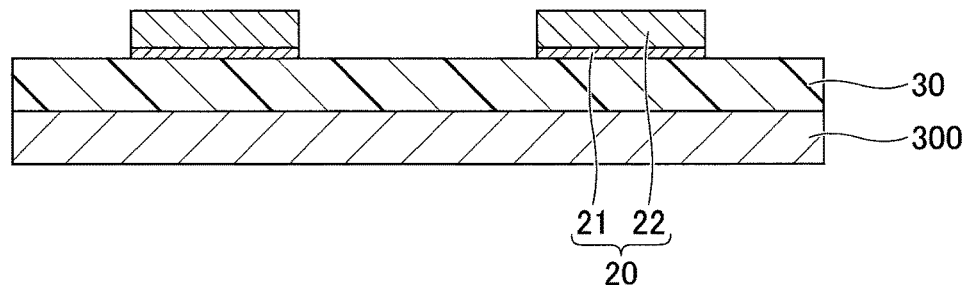
FIGS. 8A through 8D are drawings illustrating an example of the process steps of making the interconnect substrate according to the second variation of the first embodiment.
Figure 8B:
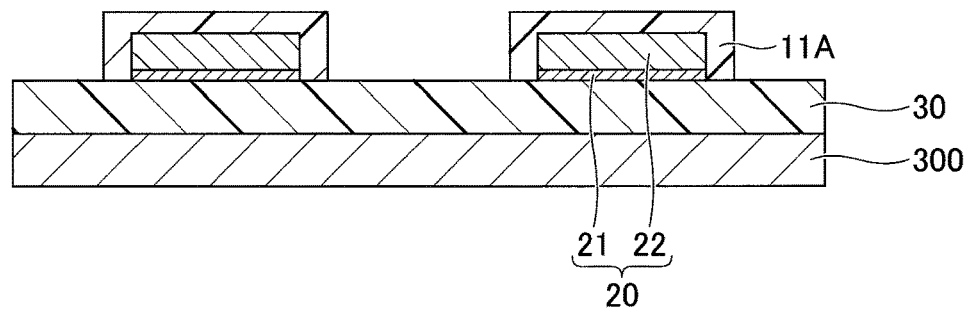

In the process step illustrated in FIG. 8B, the first resin layer 11A in a B-stage state (semi-cured state) is formed on the upper surface of the insulating layer 30 so as to cover the conductive layer 20. The first resin layer 11A is selectively formed along the upper surface and side surfaces of the conductive layer 20, without being disposed over the entire surface of the insulating layer 30. The first resin layer 11A may be formed by selectively applying a liquid or paste resin, for example, to the desired locations on the upper surface of the insulating layer 30 by use of screen printing, ink jet printing, or the like.

Alternatively, a resin film in a B-stage state (semi-cured state) may be laminated to the entire upper surface of the insulating layer 30 similarly to FIG. 3C, and, then, unneeded portions may be removed by photolithography or a laser process to form the first resin layer 11A along the upper surface and side surfaces of the conductive layer 20. The material and thickness of the first resin layer 11A are the same as those previously described. In this process step, the first resin layer 11A is not yet cured.

Figure 8C:
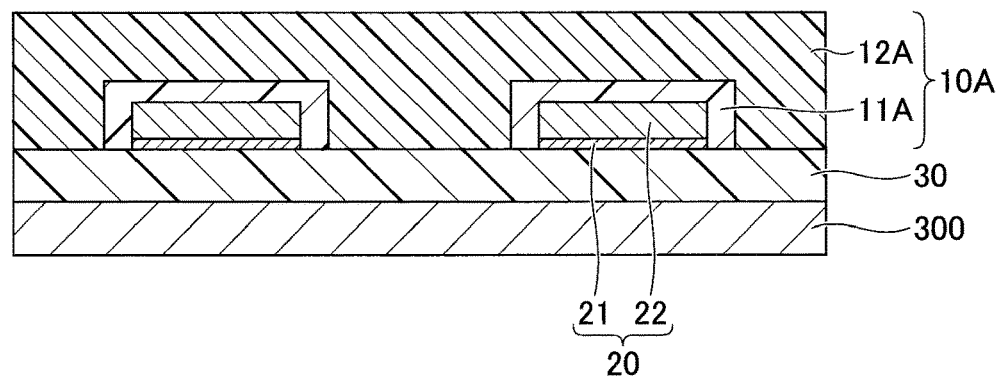

In the process step illustrated in FIG. 8C, the second resin layer 12A in a B-stage state (semi-cured state) is formed on the upper surface of the insulating layer 30 so as to cover the upper surface and side surfaces of the first resin layer 11A. The second resin layer 12A may be formed by laminating a resin film in a B-stage state (semi-cured state) onto the upper surface of the insulating layer 30 so as to cover the upper surface and side surfaces of the first resin layer 11A, for example. Alternatively, a liquid or paste resin may be applied to the upper surface of the insulating layer 30 by screen printing, roll coating, spin coating, or the like, so as to cover the upper surface and side surfaces of the first resin layer 11A. The material and thickness of the second resin layer 12A are the same as those previously described. After laminating the second resin layer 12A on the upper surface of the insulating layer 30 to cover the upper surface and side surfaces of the first resin layer 11A, the first resin layer 11A and the second resin layer 12A are heated to a predetermined temperature to be cured, thereby forming the insulating layer 10A. Pressure may also be applied while heating, if necessary.

Figure 8D:
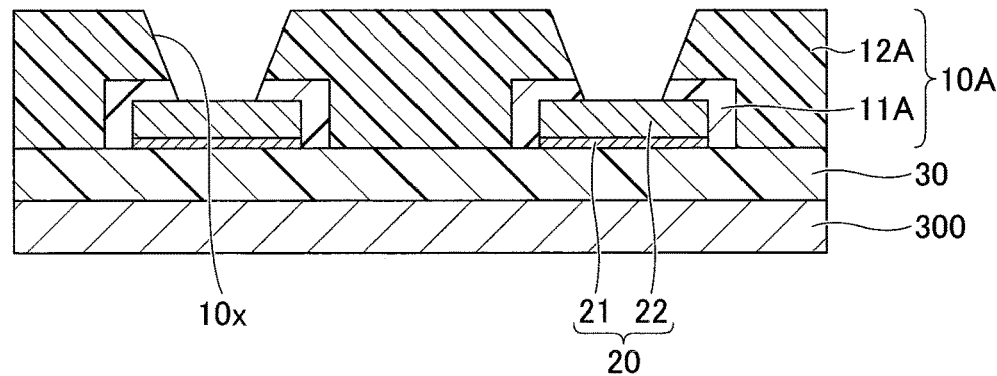

In the process step illustrated in FIG. 8D, the via holes 10x are formed through the insulating layer 10A (i.e., the second resin layer 12A and the first resin layer 11A) such as to expose the upper surface of the conductive layer 20. The via holes 10x may be formed by a laser process utilizing $CO_2$ laser or the like, for example. The shape of the via holes 10x made by a laser process is a frustum of a right circular cone having an upper end toward the position of the solder resist layer 50 and a bottom end at the upper surface of the conductive layer 20, with the diameter of the upper end being larger than the diameter of the bottom end. When the via holes 10x are formed by a laser process, a desmear process is performed to remove resin residues, of the insulating layer 10A, adhering to the upper surface of the conductive layer 20 exposed at the bottom of the via holes 10x. Subsequent steps to be performed are the same or similar to the steps starting at the step illustrated in FIG. 4B for the first embodiment.

In the insulating layer 10A of the interconnect substrate 1A described above, the thickness (e.g., 5 to 10 micrometers) of the first resin layer 11A made of a resin having a high modulus of elasticity and a low coefficient of elongation is significantly less than the thickness (e.g., about 50 to 150 micrometers) of the second resin layer 12A made of a resin having a low modulus of elasticity and a high coefficient of elongation. In the interconnect substrate 1A, the first resin layer 11A is selectively formed along the upper surface and side surfaces of the conductive layer 20, without being disposed over the entire surface of the insulating layer 30. As a result, the proportion of the first resin layer 11A to the insulating layer 10A in the interconnect substrate 1A is less than the proportion of the first resin layer 11 to the insulating layer 10 in the interconnect substrate 1. This arrangement enables the realization of an interconnect substrate 1A having higher flexibility than the interconnect substrate 1.

In the interconnect substrate 1A, the connection points between the via interconnects constituting the conductive layer 40 and the upper surface of the conductive layer 20 (i.e., the upper surface of the interconnect layer 22) are covered with the first resin layer 11A, which is made of a resin having a high modulus of elasticity and a low coefficient of elongation as in the case of the interconnect substrate 1. This arrangement relieves stress applied to the connection points, which results in a decrease in the deformation of connection points caused by mechanical stress, thereby improving the reliability of connection at the connection points. Similarly to the interconnect substrate 1, for example, haloing is less likely to occur during the desmear process performed after the forming of the via holes 10x with a laser, which improves the reliability of connections between the interconnect patterns of the interconnect substrate 1A.

<Third Variation of First Embodiment>

A third variation of the first embodiment is directed to a configuration in which openings are formed in the insulating layer 30. In connection with the third variation of the first embodiment, a description of the same or similar constituent elements as those of the previously provided descriptions may be omitted as appropriate.

Figure 9:
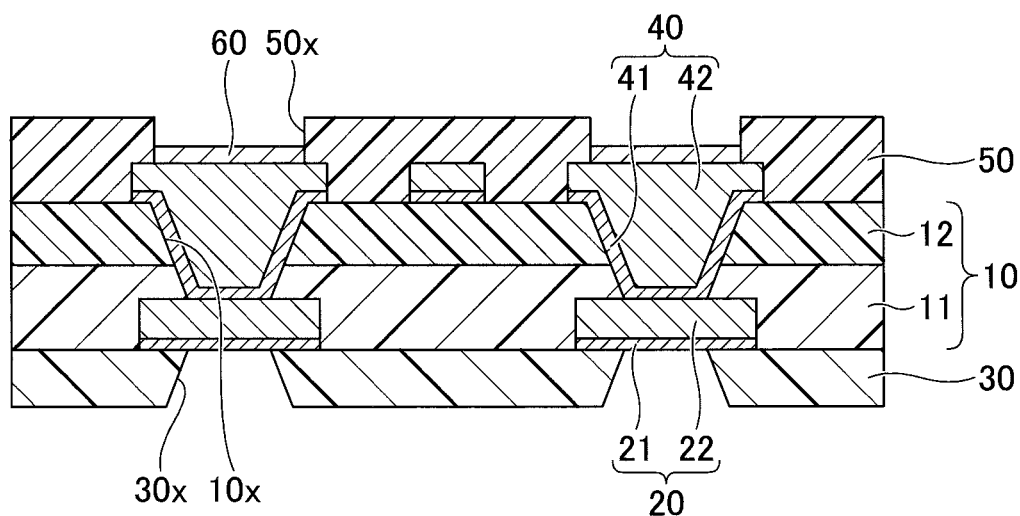
FIG. 9 is a cross-sectional view illustrating an example of an interconnect substrate according to a third variation of the first embodiment.

FIG. 9 is a cross-sectional view illustrating an example of an interconnect substrate according to the third variation of the first embodiment. Referring to FIG. 9, an interconnect substrate 1B according to the third variation of the first embodiment differs from the interconnect substrate 1 (see FIG. 1) in that openings 30x are formed through the insulating layer 30 to expose the lower surface of the adhesion layer 21.

The conductive layer 20 exposed in the openings 30x serve as pads for electrical connection with another interconnect substrate, a semiconductor package, a semiconductor chip, or the like. According to need, the lower surface of the conductive layer 20 exposed in the openings 30x may be covered with a metal layer formed by an electroless plating method, for example, or may be subjected to an OSP treatment. The metal layer or the OSP treatment may be the same as the metal layer 60 or the OSP treatment of the first embodiment.

The openings 30x may be formed by a laser process utilizing $co_2$ laser or the like, for example. The shape of the openings 30x made by a laser process is a frustum of a right circular cone having a bottom end at the lower surface of the insulating layer 30 and an upper end at the lower surface of the conductive layer 20 (i.e., the lower surface of the adhesion layer 21), with the diameter of the bottom end being larger than the diameter of the upper end. When the openings 30x are formed by a laser process, a desmear process is performed to remove resin residues, of the insulating layer 30, adhering to the lower surface of the conductive layer 20 exposed at the back end of the openings 30x.

As was described in connection with FIG. 2B, the adhesion layer 21 is formed on the upper surface of the insulating layer 30 by electroless plating or sputtering, for example. Namely, the adhesion layer 21 is a layer deposited on the upper surface of the insulating layer 30. Because of this, the adhesion between the upper surface of the insulating layer 30 and the lower surface of the adhesion layer 21 is strong. Accordingly, the thermal energy generated when the laser forms the openings 30x through the insulating layer 30 does not significantly reduce the adhesion between these two surfaces. As a result, haloing is less likely to occur during the desmear process performed after the forming of the openings 30x with a laser, which improves the reliability of connections between the interconnect patterns of the interconnect substrate 1B.

Second Embodiment

A second embodiment is directed to a configuration in which the insulating layer 10 serves as the lowermost layer. In connection with the second embodiment, a description of the same or similar constituent elements as those of the previously provided descriptions may be omitted as appropriate.

Figure 10:
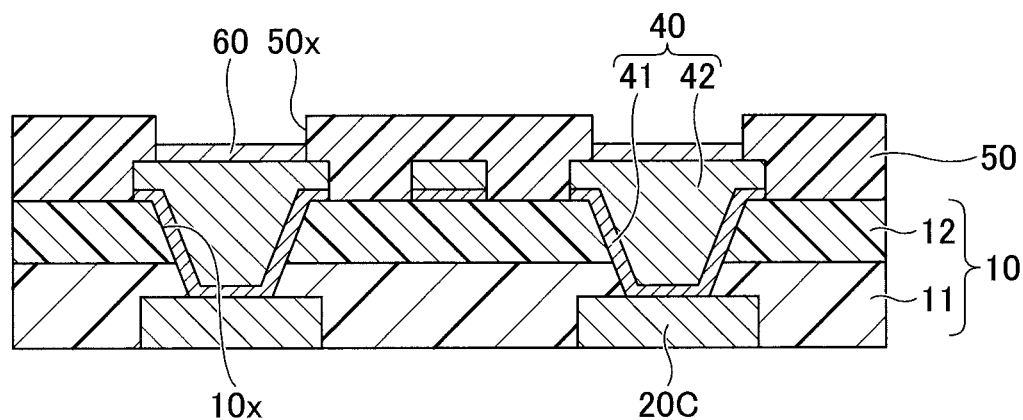
FIG. 10 is a cross-sectional view illustrating an example of an interconnect substrate according to a second embodiment.

FIG. 10 is a cross-sectional view illustrating an example of an interconnect substrate according to the second embodiment. Referring to FIG. 10, an interconnect substrate 10 according to the second embodiment differs from the interconnect substrate 1 (see FIG. 1) in that an insulating layer corresponding to the insulating layer 30 (FIG. 1) is not provided on the lower surface of the insulating layer 10 and in that the conductive layer 20 is replaced with a conductive layer 20C.

In the interconnect substrate 10, the insulating layer 10 is the lowermost layer. The first resin layer 11 of the insulating layer 10 covers the upper surface and side surfaces of the conductive layer 20C, with the lower surface of the conductive layer 20C being exposed from the lower surface of the first resin layer 11. The lower surface of the first resin layer 11 and the lower surface of the conductive layer 20C may be flush with each other, for example. Alternatively, the lower surface of the conductive layer 20C may be recessed from the lower surface of the first resin layer 11 toward the upper surface of the first resin layer 11.

The conductive layer 20C does not have a layer corresponding to the adhesion layer 21, and is comprised of a single layer corresponding to the interconnect layer 22.

Copper (Cu) may be used as the material of the conductive layer 20C, for example. The thickness of the conductive layer 20C may be about 10 to 20 micrometers, for example.

The lower surface of the conductive layer 20C exposed from the insulating layer 10 may be used as pads for electrical connection with another interconnect substrate, a semiconductor package, a semiconductor chip, or the like. According to need, the lower surface of the conductive layer 20C exposed from the insulating layer 10 may be covered with a metal layer formed by an electroless plating method, for example, or may be subjected to an OSP treatment. The metal layer or the OSP treatment may be the same as the metal layer 60 or the OSP treatment of the first embodiment.

FIGS. 11A through 11D are drawings illustrating an example of the process of making an interconnect substrate according to the second embodiment. In the process step illustrated in FIG. 11A, a support body 300 made of a metal foil (e.g., copper foil) having a flat upper surface is put in place, and a resist layer 310 with openings 310x situated at the positions corresponding to the prospective positions of the conductive layer 20C is formed on the upper surface of the support body 300. Specifically, a photosensitive dry film resist is laminated to the upper surface of the support body 300 as the resist layer 310, and, then, the openings 310x are formed by exposure and development.

Figure 11A:
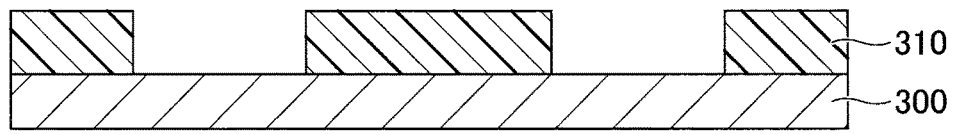
FIGS. 11A through 11D are drawings illustrating an example of the process of making the interconnect substrate according to the second embodiment.
Figure 11B:
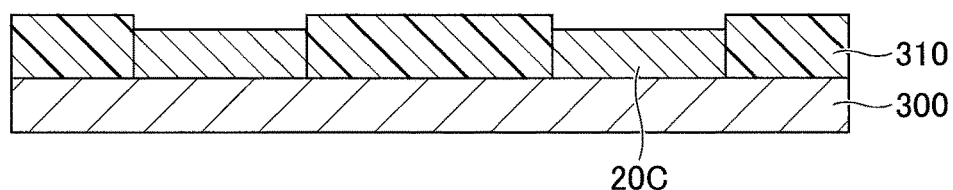

In the process step illustrated in FIG. 11B, the conductive layer 20C is formed on the upper surface of the support body 300 that is exposed in the openings 310x of the resist layer 310. The conductive layer 20C may be formed by use of electrolytic plating that utilizes the support body 300 as a power feed layer, for example. The material and thickness of the conductive layer 20C are the same as those previously described.

Figure 11C:
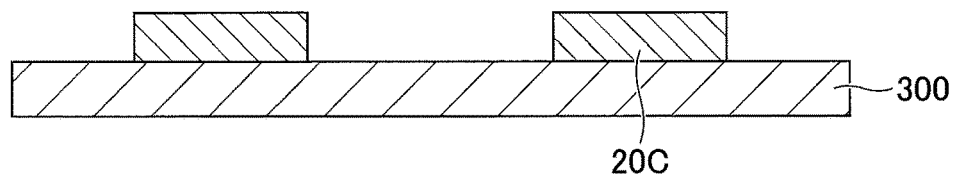
Figure 11D:
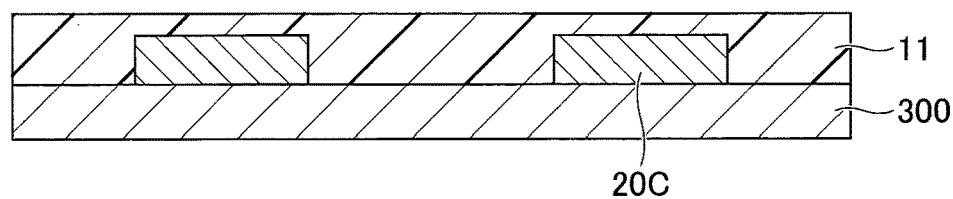

In the process step illustrated in FIG. 11C, the resist layer 310 is removed. In the process step illustrated in FIG. 11D, the first resin layer 11 in a B-stage state (semi-cured state) is formed on the entire upper surface of the support body 300 so as to cover the conductive layer 20C. The first resin layer 11 may be formed, for example, by laminating a resin film in a B-stage state (semi-cured state) onto the entire upper surface of the support body 300. Alternatively, a liquid or paste resin may be applied to the entire upper surface of the support body 300 by screen printing, roll coating, spin coating, or the like. The material and thickness of the first resin layer 11 are the same as those previously described. In this process step, the first resin layer 11 is not yet cured. Subsequent steps to be performed are the same as or similar to the steps starting at the step illustrated in FIG. 3D for the first embodiment.

When both the support body 300 and the conductive layer 20C are made of copper, the lower surface of the conductive layer 20C is etched at the time of etching and removing the support body 300, so that the lower surface of the conductive layer 20C is exposed and recessed from the lower surface of the first resin layer 11 toward the upper surface of the first resin layer 11. The conductive layer 20C may be made of copper, and the support body 300 may be implemented as a metal foil made of nickel, chromium, iron, or the like that can be removed with a different etchant from the etchant used for the copper conductive layer 20. In such a case, the lower surface of the conductive layer 20C becomes flush with the lower surface of the first resin layer 11.

As described above, the interconnect substrate 10 may be configured such that an insulating layer corresponding to the insulating layer 30 (see FIG. 1) is not formed on the lower surface of the insulating layer 10, and such that the conductive layer 20C is formed as a single layer corresponding to the interconnect layer 22 without having a layer corresponding to the adhesion layer 21 This arrangement also provides the same or similar advantages as in the first embodiment.

<First Variation of Second Embodiment>

A first variation of the second embodiment is directed to another example of the method of making the insulating layer 30. In connection with the first variation of the second embodiment, a description of the same or similar constituent elements as those of the previously provided descriptions may be omitted as appropriate.

Figure 12A:
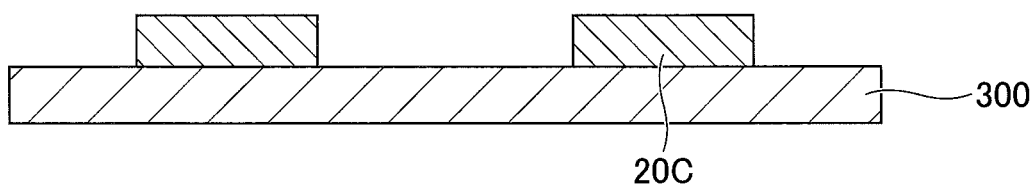
FIGS. 12A and 12B are drawings illustrating an example of the process steps of making an interconnect substrate according to a first variation of the second embodiment.
Figure 12B:
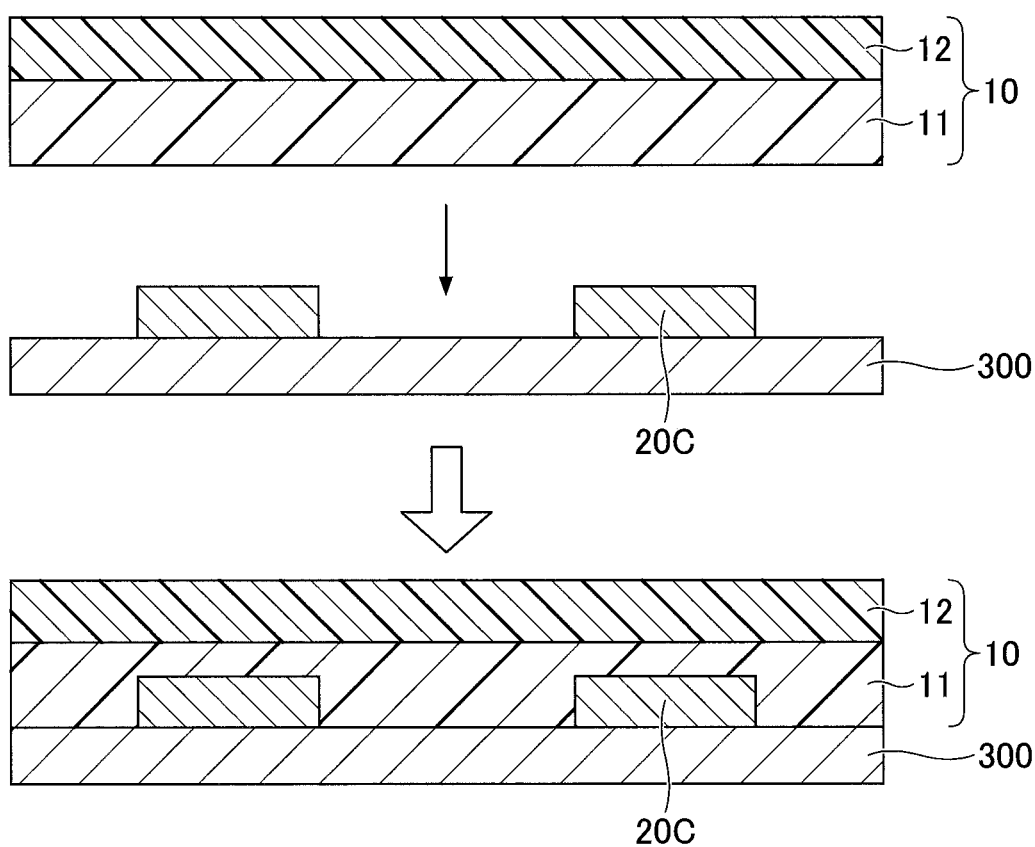

FIGS. 12A and 12B are drawings illustrating an example of the process steps of making an interconnect substrate according to the first variation of the second embodiment. The process steps similar to those illustrated in FIG. 11A through FIG. 11C for the second embodiment are performed to make the structure illustrated in FIG. 12A.

In the process step illustrated in FIG. 12B, the insulating layer 10 made of an insulating multilayer film in which the second resin layer 12 is laminated onto the first resin layer 11 in advance is put in place. The insulating layer 10 is then laminated on the upper surface of the support body 300 of the structure illustrated in FIG. 12A to cover the conductive layer 20C. Subsequently, the insulating layer 10 is heated to a predetermined temperature for curing. Pressure may also be applied while heating, if necessary. Subsequent steps to be performed are the same as or similar to the steps starting at the step illustrated in FIG. 4A for the first embodiment.

In this manner, the first resin layer 11 and the second resin layer 12 may be sequentially laminated to the upper surface of the support body 300 to form the insulating layer 10, or an insulating multilayer film having the second resin layer 12 laminated on the first resin layer 11 in advance may be laminated to the upper surface of the support body 300 to form the insulating layer 10.

Although a description has been given with respect to preferred embodiments and the like, the present invention is not limited to these embodiments and the like, but various variations and modifications may be made to these embodiments and the like without departing from the scope of the present invention.

For example, in the interconnect substrate 1B illustrated in FIG. 9 or in the interconnect substrate 10 illustrated in FIG. 10, the first resin layer 11 may be selectively formed along the upper surface and the side surfaces of the conductive layer 20 in the same manner as in the interconnect substrate 1A illustrated in FIG. 7. This arrangement provides an interconnect substrate having higher flexibility than the interconnect substrate 1B and the interconnect substrate 10.

According to at least one embodiment, an interconnect substrate for which haloing is less likely to occur is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

In addition to the subject matter recited in the claims, the present disclosures include aspects of the subject matter as set out non-exhaustively in the following numbered clauses.

[Clause 1] A method of making an interconnect substrate, comprising:

forming a first conductive layer on a support body;

forming, on the support body, an insulating layer including a first resin layer and a second resin layer, the first resin layer covering an upper surface and side surfaces of the first conductive layer, the second resin layer covering an upper surface of the first resin layer;

performing a laser process to form a via hole through both the second resin layer and the first resin layer to expose the upper surface of the first conductive layer;

forming a second conductive layer including an interconnect pattern and a via interconnect, the interconnect pattern being disposed on an upper surface of the second resin layer opposite from a lower surface thereof that is in contact with the upper surface of the first resin layer, the via interconnect being disposed in the via hole to connect the interconnect pattern to the upper surface of the first conductive layer; and removing the support body, wherein the step of forming the insulating layer forms the first resin layer that is made of a resin having a higher modulus of elasticity and a lower coefficient of elongation than the second resin layer.

[Clause 2] The method as recited in clause 1, further comprising forming another insulating layer directly on the support body before the step of forming the first conductive layer, wherein the step of forming the first conductive layer forms the first conductive layer directly on the another insulating layer, and wherein the step of forming the another insulating layer forms the another insulating layer with a same resin as the second resin layer.

[Clause 3] The method as recited in clause 2, wherein the step of forming the first conductive layer directly on the another insulating layer includes:

forming an adhesion layer directly on the another insulating layer; and forming an interconnect layer on the adhesion layer.

[Clause 4] The method as recited in clause 1, wherein the step of forming the insulating layer includes:

placing an insulating multilayer film that includes the first resin layer and the second resin layer laminated on the first resin layer in advance; and laminating the insulating multilayer film on the support body to cover the upper surface and the side surfaces of the first conductive layer.

What is claimed is:

1. An interconnect substrate comprising:

an insulating layer having a first resin layer and a second resin layer covering an upper surface of the first resin layer;

a first conductive layer having an upper surface, a lower surface, and side surfaces, the upper surface and the side surfaces of the first conductive layer being covered with the first resin layer, the lower surface of the first conductive layer being exposed from a lower surface of the first resin layer; and a second conductive layer including an interconnect pattern and a via interconnect, the interconnect pattern being disposed on an upper surface of the second resin layer opposite from a lower surface thereof that is in contact with the upper surface of the first resin layer, the via interconnect penetrating through both the second resin layer and the first resin layer to connect the interconnect pattern to the upper surface of the first conductive layer, wherein the first resin layer is made of a resin having a higher modulus of elasticity and a lower coefficient of elongation than the second resin layer.

2. The interconnect substrate as claimed in claim 1, further comprising another insulating layer covering the lower surface of the first resin layer and the lower surface of the first conductive layer, wherein the another insulating layer is made of a same resin as the second resin layer.

3. The interconnect substrate as claimed in claim 2, wherein the first conductive layer includes an adhesion layer and an interconnect layer disposed on the adhesion layer, the adhesion layer being in contact with the another insulating layer.

4. The interconnect substrate as claimed in claim 3, wherein the another insulating layer has an opening penetrating therethrough to expose the adhesion layer.

5. The interconnect substrate as claimed in claim 1, wherein the first resin layer is selectively situated along the upper surface and the side surfaces of the first conductive layer, and the second resin layer covers the upper surface and side surfaces of the first resin layer.

6. The interconnect substrate as claimed in claim 1, wherein the second resin layer covers an entirety of the upper surface of the first resin layer, without covering side surfaces of the first resin layer.

* * * * *